(12) United States Patent
Ting et al.

(10) Patent No.: US 8,080,289 B2
(45) Date of Patent: Dec. 20, 2011

(54) METHOD FOR MAKING AN ALIGNED CARBON NANOTUBE

(75) Inventors: Jyh-Ming Ting, Taipei (TW); Kun-Hou Liao, Tainan (TW)

(73) Assignee: National Cheng Kung University, Tainan (TW)

( * ) Notice: Subject to any disclaimer, the term of this patent is extended or adjusted under 35 U.S.C. 154(b) by 584 days.

(21) Appl. No.: 12/210,855

(22) Filed: Sep. 15, 2008

(65) Prior Publication Data

US 2009/0039055 A1 Feb. 12, 2009

Related U.S. Application Data

(63) Continuation-in-part of application No. 11/030,364, filed on Jan. 5, 2005, now abandoned.

(30) Foreign Application Priority Data

Sep. 30, 2004 (TW) .............................. 93129621 A

(51) Int. Cl.
*C23C 16/00* (2006.01)
*C23F 1/00* (2006.01)

(52) U.S. Cl. .......................... 427/577; 977/843; 216/37

(58) Field of Classification Search ........................ None
See application file for complete search history.

(56) References Cited

U.S. PATENT DOCUMENTS

| 6,350,488 | B1 | 2/2002 | Lee et al. |
| 2002/0160111 | A1 | 10/2002 | Sun et al. |
| 2003/0059968 | A1 | 3/2003 | Cheng et al. |
| 2004/0099438 | A1 | 5/2004 | Arthur et al. |

*Primary Examiner* — Timothy Meeks
*Assistant Examiner* — Joseph Miller, Jr.
(74) *Attorney, Agent, or Firm* — Kilpatrick Townsend & Stockton LLP

(57) ABSTRACT

A method for making an aligned carbon nanotube includes the steps of a) applying a layer of a ferrosilicon alloy film onto a substrate, b) etching the layer of the ferrosilicon film to form a plurality of fine ferrosilicon alloy particles that are distributed properly on the substrate, and c) placing the substrate of step (b) into a microwave plasma enhanced chemical vapor deposition system, and supplying a mixture of a carbon-containing reaction gas and a balance gas at a predetermined flow ratio so as to grow carbon nanotubes on the fine ferrosilicon alloy particles, wherein said ferrosilicon alloy of step (a) comprises silicon ranging from 15 wt % to 25 wt %; and step (c) is conducted at a temperature ranging from 300 to 380° C.

11 Claims, 6 Drawing Sheets

METHOD FOR MAKING AN ALIGNED CARBON NANOTUBE

CROSS-REFERENCE TO RELATED APPLICATION

This is a Continuation-in-part of U.S. application Ser. No. 11/030,364, filed Jan. 5, 2005, now pending, which in turn claims the priority of Taiwan patent Application No. 093129621, filed Sep. 30, 2004, the disclosures of which are incorporated herein by reference.

BACKGROUND OF THE INVENTION

1. Field of the Invention

The invention relates to a method for making an aligned carbon nanotube, more particularly to a method for making an aligned carbon nanotube at a relatively low temperature.

2. Description of the Related Art

Chemical vapor deposition (referred to as CVD hereinafter) and related techniques derived therefrom, such as microwave plasma enhanced chemical vapor deposition (referred as to MPCVD hereinafter), are commonly used to make a carbon nanotube. In the CVD method or the related techniques, a porous substrate coated with a catalyst is placed in a CVD or MPCVD system. A carbon-containing reaction gas suitable for growing the carbon nanotube is introduced into the CVD or MPCVD system. The carbon-containing reaction gas is cleaved or ionized so as to react with the catalyst on the substrate and to grow the carbon nanotube.

Although the aforesaid conventional method can be used to make the carbon nanotube, the conventional method has to be conducted at a relatively high temperature and at a relatively slow reaction rate.

The reaction temperature and the reaction rate at which the carbon nanotube is made are affected primarily by the composition of the catalyst. The main function of the catalyst is to react with the carbon atoms produced by cleaving the carbon-containing reaction gas via a plasma process so as to deposit and grow the carbon nanotube. Catalysts for the growth of carbon nanotubes (CNTs) can be a single element catalyst or contain more than one element. An elemental catalyst, such as Ni or Mo, generally allows the growth of CNTs through a multi-step process to form CNTs. To improve the performance of elemental catalysts, an additive such as Mo or Y may be used. The second minor element has been found to, for example, lower the CNT growth temperature or prevent the formation of undesired graphite particles. The growth rate of the carbon nanotube is affected by the activity of the catalyst, which is restricted by the reaction temperature. The catalyst used in the conventional CVD or MPCVD process requires a relatively high catalysis temperature, which is generally higher than 550° C.

U.S. Pat. No. 6,350,488 discloses a method of synthesizing carbon nanotubes, which uses cobalt, nickel, iron or their alloys as catalysts. The CNTs growth temperature is as high as 700 to 1000° C., and the growth rate is 12 μm/min (refer to the example 1 of U.S. Pat. No. 6,350,488).

US 2002/016011 discloses a method for fabrication of carbon nanotubes film, which uses Ni/Cr as catalyst. The CNTs growth temperature is 550° C., and the growth rate is at the order of 10 nm/min (refer to the example 1 of US 2002/016011).

Therefore, it is expected to increase the growth rate of carbon nanotubes at a lower reaction temperature to reduce the complexness of fabrication procedure and hence reduce the fabrication cost.

SUMMARY OF THE INVENTION

The object of the present invention is to provide a method for making an aligned carbon nanotube which can be conducted at a relatively low temperature and a relative high carbon nanotube growth rate.

Accordingly, the method for making an aligned carbon nanotube of this invention includes the steps of:

(a) applying a layer of a ferrosilicon alloy film onto a substrate;

(b) etching the layer of the ferrosilicon film to form a plurality of fine ferrosilicon alloy particles that are distributed properly on the substrate; and (c) placing the substrate of step (b) into a microwave plasma enhanced chemical vapor deposition system, and supplying a mixture of a carbon-containing reaction gas and a balance gas at a predetermined flow ratio so as to grow carbon nanotubes on the fine ferrosilicon alloy particles;

wherein said ferrosilicon alloy of step (a) comprises silicon ranging from 15 wt % to 25 wt %; and step (c) is conducted at a temperature ranging from 300 to 380° C.

Preferably, step (c) is conducted at a microwave power ranging from 250 to 1500 W and at a working pressure ranging from 20 to 40 Torr.

Preferably, the substrate is selected form the group consisting of silicon substrates and polymer substrates.

Preferably, step (a) is conducted by a process selected from the group of sputtering, chemical vapor deposition, electroplating, and printing.

Preferably, step (b) is conducted by placing the substrate coated with the plasma enhanced chemical vapor deposition system and enhanced chemical vapor deposition system.

Preferably, the etching gas includes at least one gas selected from the group consisting of hydrogen, oxygen, nitrogen, and ammonia.

Preferably, each of the fine ferrosilicon alloy particles has a particle size ranging from 5 to 25 nm.

Preferably, the fine ferrosilicon alloy particles have a distribution density ranging from $3 \times 10^{10}$ to $4 \times 10^{10}$ cm$^{-2}$.

Preferably, the predetermined flow ratio of the carbon-containing reaction gas to the balance gas is 2:9.

Preferably, the carbon-containing reaction gas includes at least one gas selected form the group consisting of methane, ethane, propane, ethyne, and benzene.

The present invention also provided a ferrosilicon catalyst for growing of carbon nanotubes, comprising: 75 wt % to 85 wt % of Fe; and 15 wt % to 25 wt % of Si.

To sum up, the method for making an aligned carbon nanotube of the present invention uses ferrosilicon alloy, in which the content of the silicon in the ferrosilicon alloy is ranging from 15 wt % to 25 wt %, as catalyst. The method of the present invention produces carbon nanotubes at a relative low temperature (300 to 380° C.), while maintaining a high growth rate (>0.5 μm/min).

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
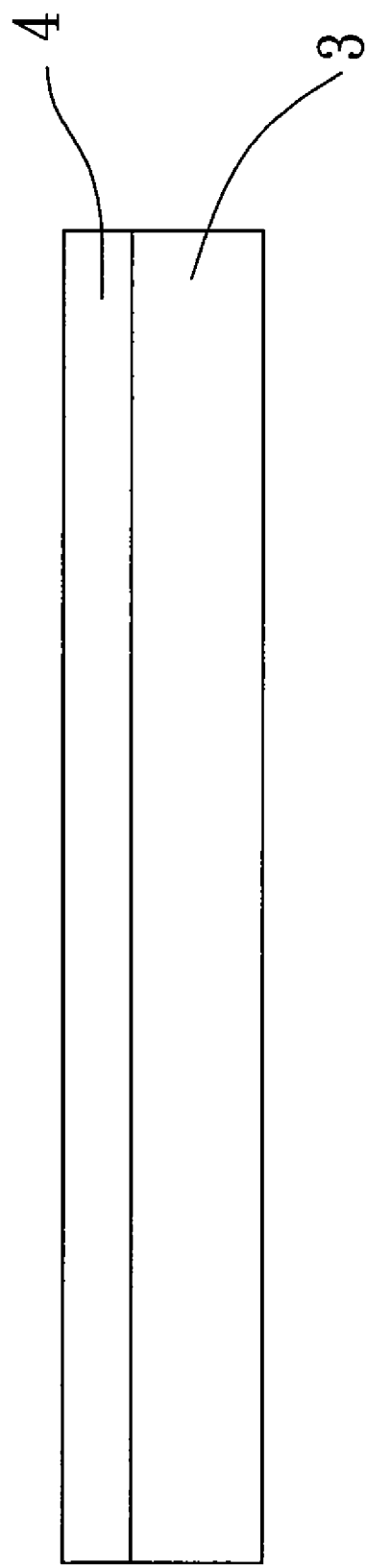
FIGS. 1, 2 and 3 are schematic views showing the consecutive steps of the preferred embodiment of a method for making an aligned carbon nanobute according to this invention.
Figure 2:
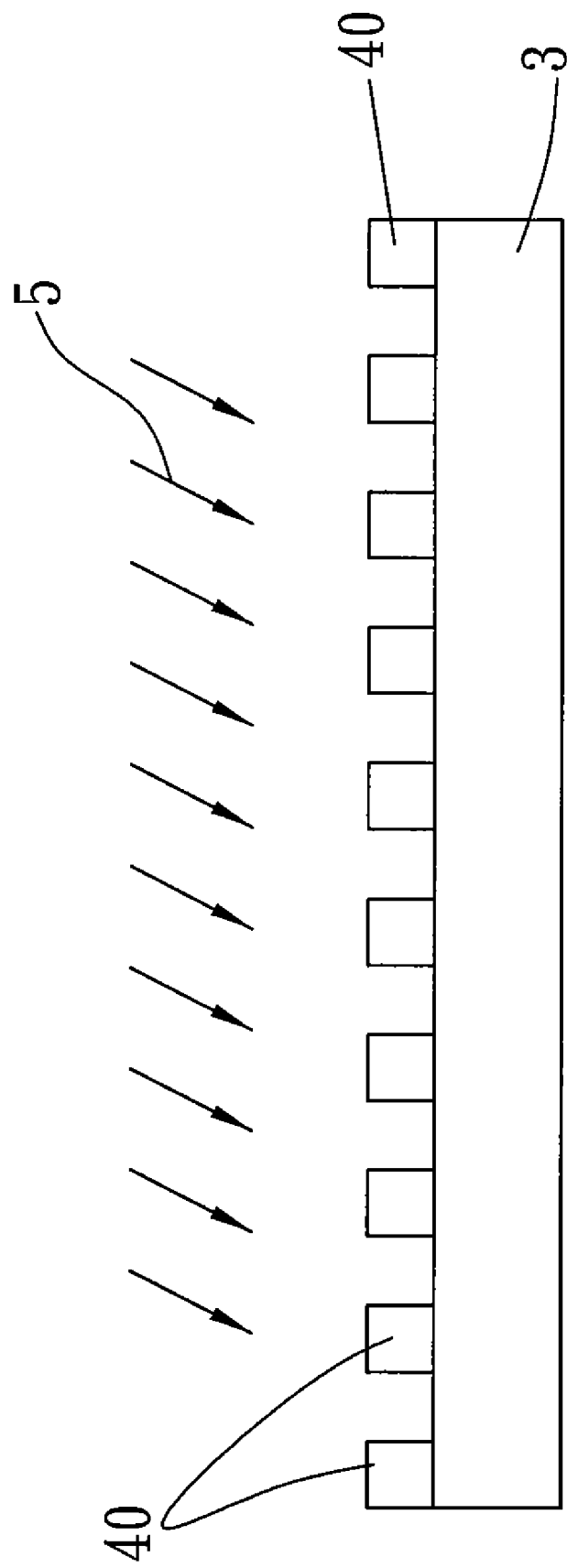
Figure 3:
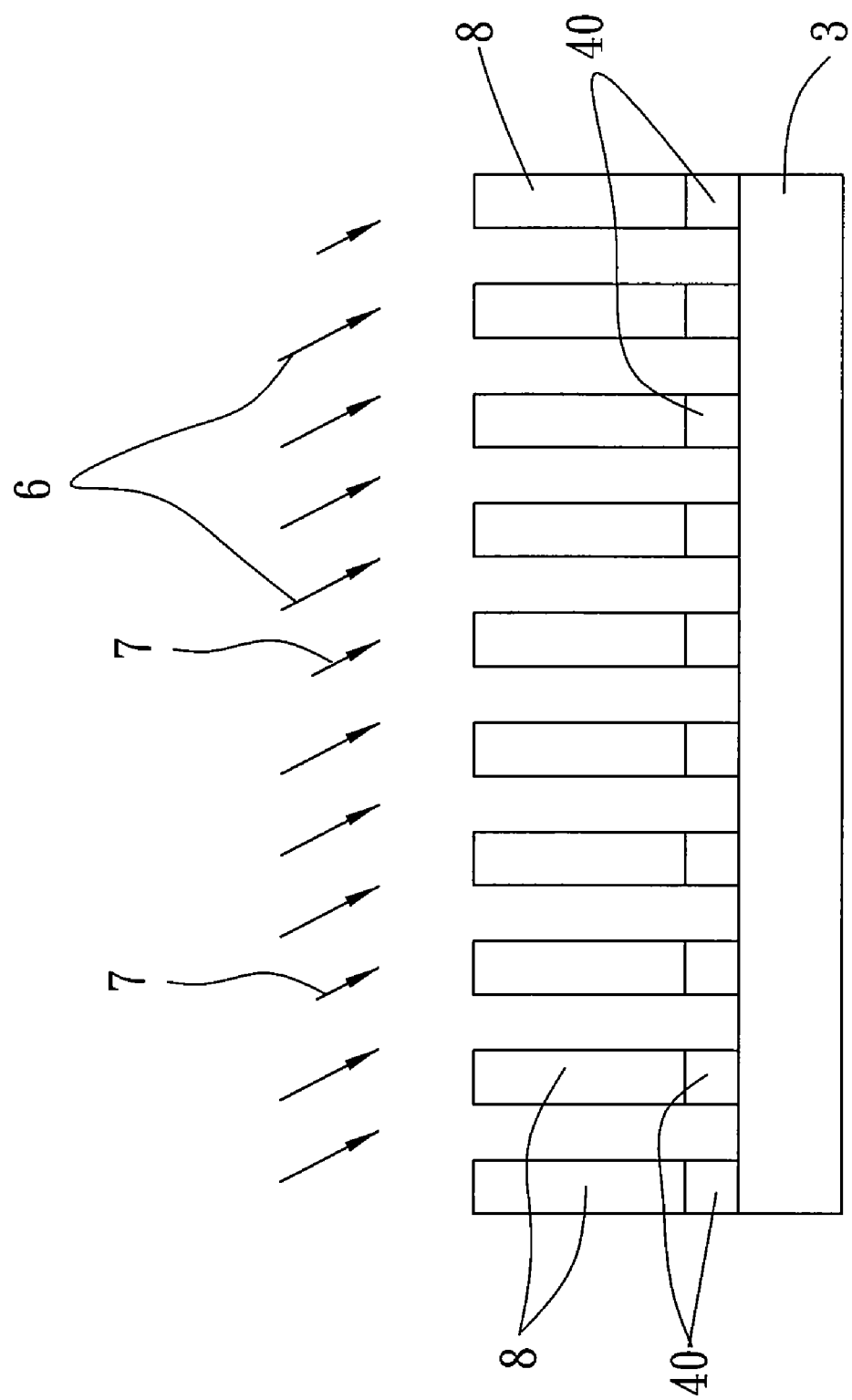

Referring to FIGS. 1, 2 and 3, the preferred embodiment of the method for making an aligned carbon nanotube according to this invention includes the following steps:

A) Applying:

As shown in FIG. 1, a layer of a ferrosilicon alloy film 4 is applied onto a substrate 3 by sputtering. The ferrosilicon alloy film 4 is used as a catalyst for growing carbon nanotubes in the preferred embodiment. Since silicon contained in the ferrosilicon alloy can improve the diffusion capability of carbon atoms and the catalytic activity of iron contained in the ferrosilicon alloy, the temperature required to enhance the catalytic activity can be lowered. In the preferred embodiment, the sputtering process is conducted for a period of about 3 minutes at a sputtering power of about 50 W under a working pressure of about $10^{-2}$ Torr.

The substrate used in the preferred embodiment is silicon substrate. However, other materials well known in the art, such as polymeric materials, can also be used. Additionally, while sputtering is employed in this invention, other processes well known in the art, such as chemical vapor deposition, physical vapor deposition, electroplating, printing, and the like, can also be used.

B) Etching:

As shown in FIG. 2, the substrate 3 coated with the layer of the ferrosilicon film 4 is placed in an MPCVD system (not shown), and an etching gas 5 is introduced into the MPCVD system to etch the ferrosilicon film 4 so as to form a plurality of fine ferrosilicon alloy particles 40 that are distributed properly on the substrate 3. The size of the ferrosilicon alloy particles 40 ranges from 5 to 25 nm, and the distribution density thereof ranges from $3 \times 10^{10}$ to $4 \times 10^{10}$ $cm^{-2}$.

Hydrogen is used as the etching gas in this preferred embodiment. However, other suitable gases well known in the art, such as oxygen, nitrogen, and ammonia, can also be used. If desired, a mixture of at least two of the aforesaid gases can be used as the etching gas. The etching process is conducted for a period of about 5 minutes at a microwave power of about 500 W under a working pressure of about 20 Torr. The size and the distribution density of the ferrosilicon alloy particles 40 can be adjusted according to the etching conditions, such as the microwave power, the working pressure, the etching time, and the like.

C) Growing the Carbon Nanotubes:

As shown in FIG. 3, a mixture of a carbon-containing reaction gas 6 and a balance gas 7 at a predetermined flow ratio is supplied to the MPCVD system to grow carbon nanotubes 8 on the ferrosilicon alloy particles 40 along a substantially vertical direction at a temperature ranging from 300 to 380° C. Since the MPCVD technique is well known to the skilled artisan, it will not be described in detail herein for the sake of brevity.

Figure 4:
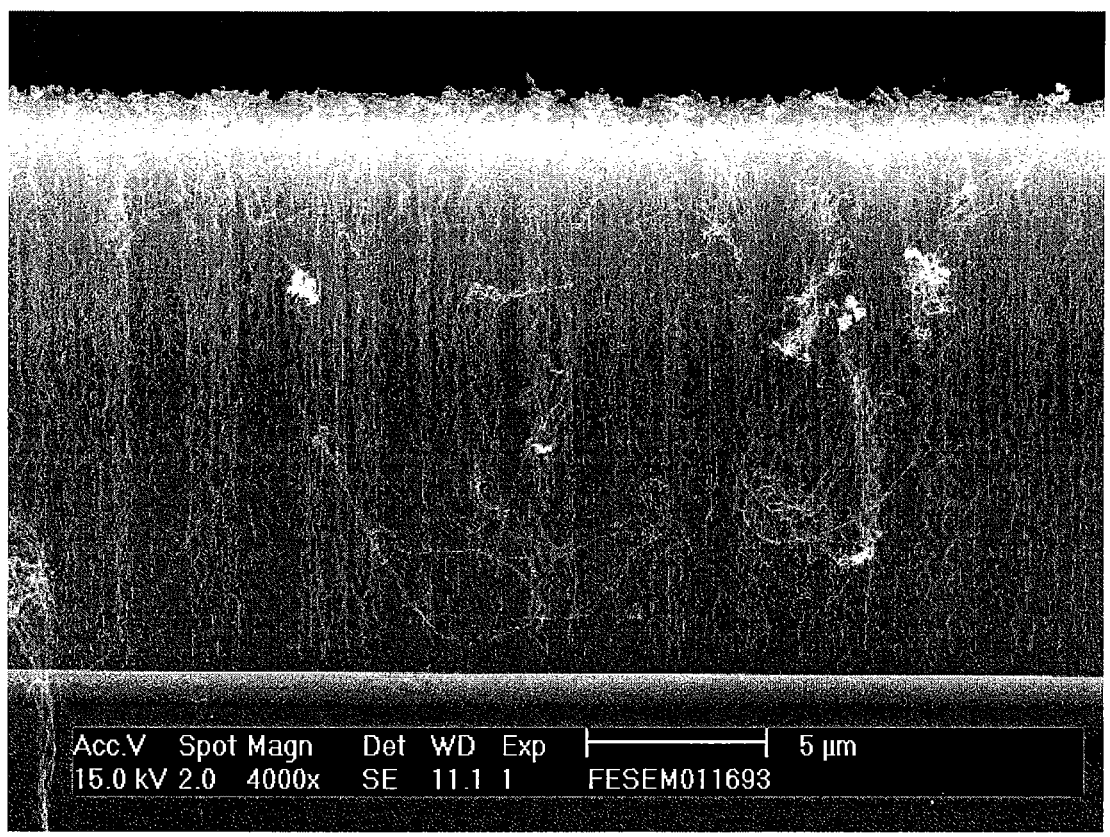
FIG. 4 is a field emitted sweep electron microscopic view showing the profile and distribution of a plurality of the carbon nanotubes made according to the preferred embodiment.

The balance gas 7 is used for cleaning and reducing the ferrosilicon alloy particles 40 during the process of growing the carbon nanotubes 8. Therefore, when the balance gas 7 is introduced into the MPCVD system along with the carbon-containing reaction gas 6, the balance gas 7 can clean up amorphous carbon which is adsorbed on the ferrosilicon alloy particles 40 and which may interfere with entry of the desired carbon atoms into the ferrosilicon alloy particles 40. Therefore, the carbon atoms resulted from the cleaving of the carbon-containing reaction gas 6 can diffuse among and interact with the ferrosilicon alloy particles 40 so as to grow the carbon nanotubes 8. The growth of the carbon nanotubes 8 can be improved by controlling the flow ratio of the carbon-containing reaction gas 6 to the balance gas 7. The carbon-containing reaction gas 6 and the balance gas 7 used in this preferred embodiment are methane and hydrogen, respectively, and the flow ratio of the carbon-containing reaction gas 6 to the balance gas 7 is preferably 2:9. Preferably, the carbon nanotubes 8 are grown at a microwave power ranging from 250 to 1500 W under a working pressure ranging from 20 to 40 Torr. In addition, while methane is used as the carbon-containing reaction gas in this preferred embodiment, other suitable gases, such as ethane, propane, ethyne, benzene, and the like, can also be used. If desired, a mixture of at least two of methane, ethane, propane, ethyne, benzene, and the like can be used as the carbon-containing reaction gas 6. Furthermore, in addition to hydrogen, other suitable gases, such as oxygen, nitrogen, and ammonia, can be used as the balance gas 7. If desired, a mixture of at least two of hydrogen, oxygen, nitrogen, and ammonia can be used as the balance gas 7 in this invention. The carbon nanotubes 8 made according to the preferred embodiment is shown in FIG. 4. The distribution density, the tube size, and the growth rate of the carbon nanotubes 8 are $3 \times 10^{10}$-$4 \times 10^{10}$ $cm^{-2}$, 5-25 nm, and 13 um/min, respectively. The ratio of height to diameter of each of the carbon nanotubes 8 ranges from 1500:1 to 7500:1.

Figure 5:
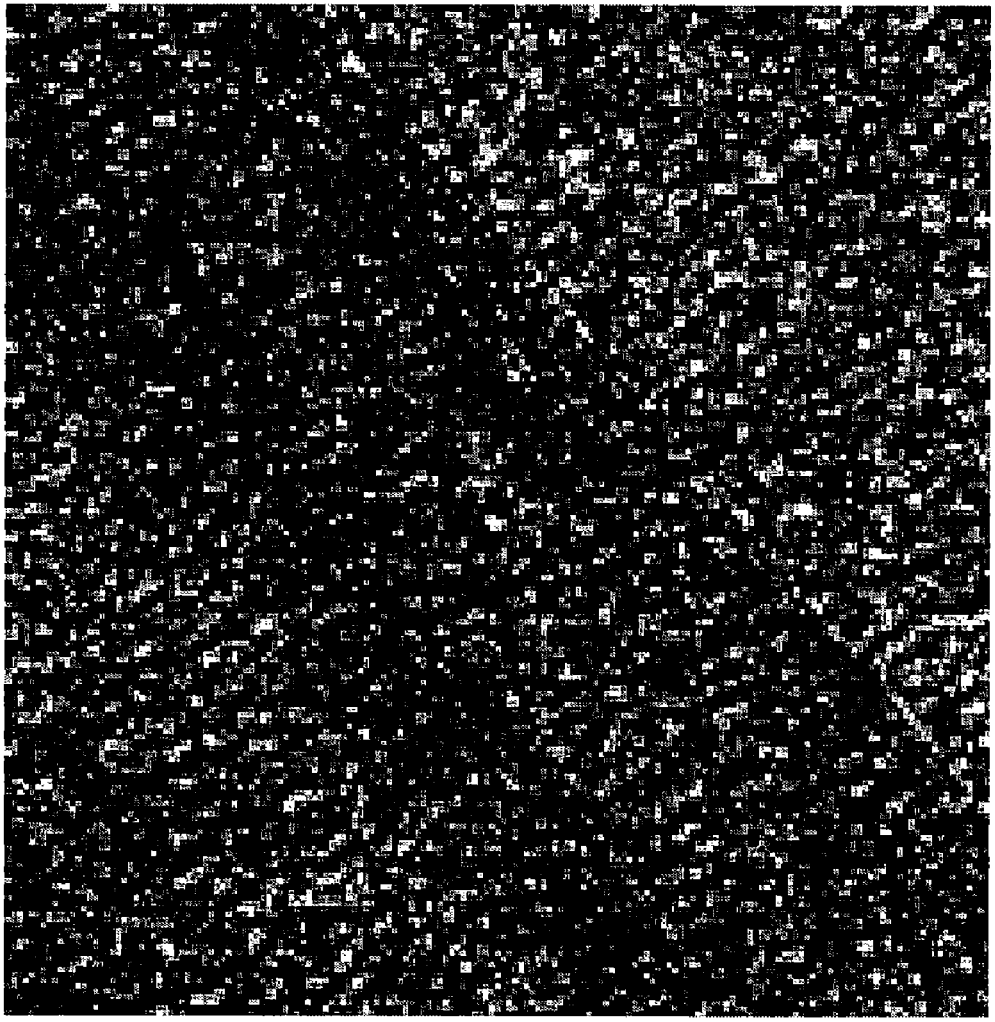
FIG. 5 is a transmission electron microscopic view showing a tubular structure of a single one of the nanotubes made according to the preferred embodiment.

The structure of a single one of the carbon nanotubes 8 is shown in FIG. 5, in which the tube diameter is 11 nm. The tubular wall of each of carbon nanotubes 8 is composed of 8 graphite layers, and has an integral structure.

In view of the aforesaid, in the method of this invention, since the ferrosilicon film 4 has an improved catalytic activity, the diffusion rate of the carbon atoms, which are obtained by cleaving the carbon-containing reaction gas 6, into the ferrosilicon film 4 can be increased. Therefore, the temperature required for growing the carbon nanotubes 8 is reduced. Furthermore, the relatively high distribution density of the ferrosilicon alloy particles 40 and the designed flow ratio of the carbon-containing reaction gas 6 to the balance gas 7 result in the growth of the carbon nanotubles 8 at a distribution density up to $4 \times 10^{10}$ $cm^{-2}$ and at a growth rate up to 13 um/min. Therefore, the productivity of the carbon nanotubes 8 can be increased so as to reduce production costs. Since the carbon nanotube 8 made according to this invention is characterized by a relatively small tube diameter distribution and a relatively high ratio of height to diameter, and requires a relatively low temperature during the growing process, the method for making an aligned carbon nanotube according to this invention can be used in various applications, such as field emitted flat displays, integrated circuits, biochips, and the like.

(D) Effects of Etched Fe—Si Thin Film

Figure 6:
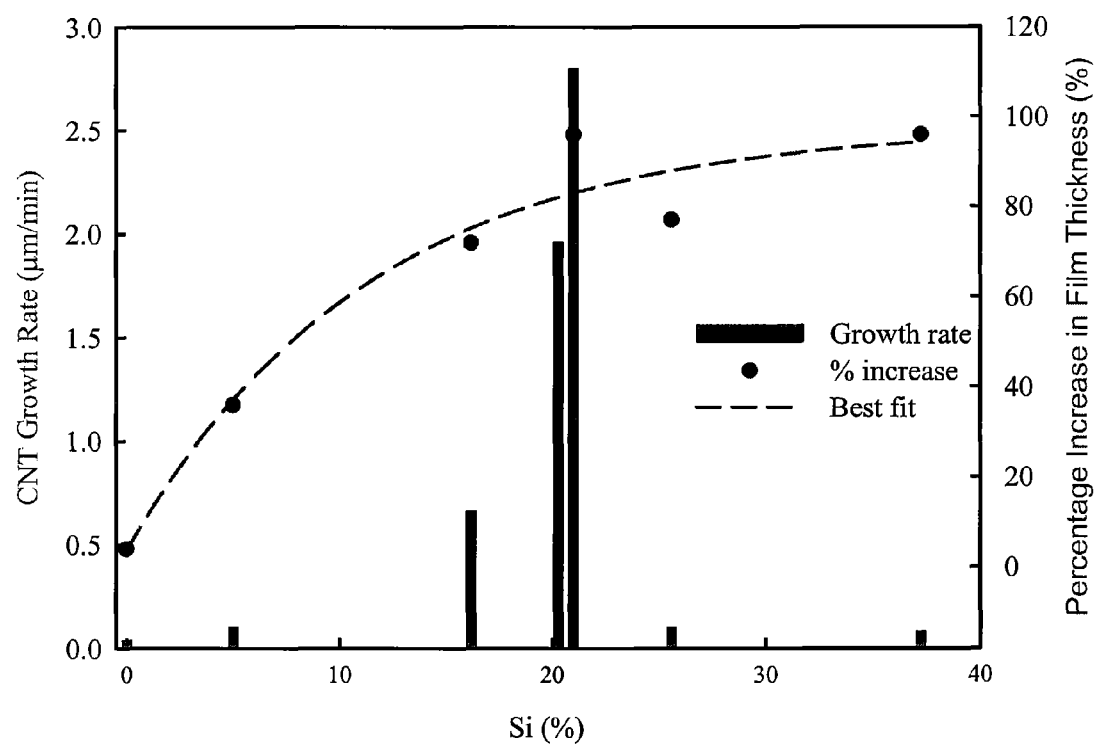
FIG. 6 shows the growth rate of carbon nanotube at different concentration of Si in ferrosilicon alloy.

In order to investigate the effect of Si concentration to the growth rate of carbon nanotube, ferrosilicon with different silicon concentrations was used as catalyst to carry out the reaction, and other reaction conditions were the same as describe above. FIG. 6 shows the growth rate of carbon nanotubes at different silicon concentrations of ferrosilicon. As shown in FIG. 6, the maximum growth rate of carbon occurs at a silicon concentration of about 21%. At the silicon concentration of 15% to 25%, the growth rate of carbon nanotube is enhanced. It should be noted that the concentration of silicon in ferrosilicon alloy changes after etching. The concentration indicated therein is the concentration before etching.

Therefore, the present invention uses ferrosilicon as the catalyst for making aligned carbon nanotube, which could lower the reaction temperature to about 300 to 380° C. while maintaining a high growth rate. More particularly, at the concentration of Si in the ferrosilicon alloy being from 15 wt % to 25 wt %, the growth rate of carbon nanotube is enhanced.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A method for making an aligned carbon nanotube, comprising the steps of:
   (a) applying a layer of a ferrosilicon alloy film onto a substrate;
   (b) etching the layer of the ferrosilicon film to form a plurality of fine ferrosilicon alloy particles that are distributed on the substrate; and
   (c) placing the substrate of step (b) into a microwave plasma enhanced chemical vapor deposition system, and supplying a mixture of a carbon-containing reaction gas and a balance gas at a predetermined flow ratio so as to grow carbon nanotubes on the fine ferrosilicon alloy particles;
   wherein said ferrosilicon alloy of step (a) comprises silicon ranging from 15 wt % to 25 wt %; and step (c) is conducted at a temperature ranging from 300 to 380° C.

2. The method as claimed in claim 1, wherein step (c) is conducted at a microwave power ranging from 250 to 1500 W and at a working pressure ranging from 20 to 40 Torr.

3. The method as claimed in claim 1, wherein the substrate is selected from the group consisting of silicon substrates and polymer substrates.

4. The method as claimed in claim 1, wherein step (a) is conducted by a process selected from the group consisting of sputtering, chemical vapor deposition, physical vapor deposition, electroplating, and printing.

5. The method as claimed in claim 1, wherein step (b) is conducted by placing the substrate coated with the layer of the ferrosilicon alloy film in the microwave plasma enhanced chemical vapor deposition system and supplying an etching gas into the microwave plasma enhanced chemical vapor deposition system.

6. The method as claimed in claim 5, wherein the etching gas includes at least one gas selected from the group consisting of hydrogen, oxygen, nitrogen, and ammonia.

7. The method as claimed in claim 5, wherein each of the fine ferrosilicon alloy particles has a particle size ranging from 5 to 25 nm.

8. The method as claimed in claim 5, wherein the fine ferrosilicon alloy particles have a distribution density ranging from $3\times10^{10}$ to $4\times10^{10}$ cm$^{-2}$.

9. The method as claimed in claim 1, wherein the predetermined flow ratio of the carbon-containing reaction gas to the balance gas is 2:9.

10. The method as claimed in claim 9, wherein the carbon-containing reaction gas includes at least one gas selected from the group consisting of methane, ethane, propane, ethyne, and benzene.

11. The method as claimed in claim 9, wherein the balance gas includes at least one gas selected from the group consisting of hydrogen, oxygen, nitrogen, and ammonia.

* * * * *